United States Patent
Borrego Bel et al.

(10) Patent No.: US 7,164,272 B1
(45) Date of Patent: Jan. 16, 2007

(54) MODULAR UNIT CONNECTABLE TO THE BATTERY OF A VEHICLE FOR MONITORING ITS CONDITION AND PROTECTING THE ELECTRICAL SYSTEM OF SAID VEHICLE

(75) Inventors: Carles Borrego Bel, Valls (ES); Joan Fontanilles Pinas, Valls (ES); Daniel Guasch Murillo, Valls (ES); Gerard Vall Gendre, Valls (ES)

(73) Assignee: Lear Automotive (EEDS) Spain, S.L. (ES)

( * ) Notice: Subject to any disclaimer, the term of this patent is extended or adjusted under 35 U.S.C. 154(b) by 248 days.

(21) Appl. No.: 10/398,860

(22) PCT Filed: Oct. 13, 2000

(86) PCT No.: PCT/ES00/00393

§ 371 (c)(1),
(2), (4) Date: Nov. 17, 2003

(87) PCT Pub. No.: WO02/30712

PCT Pub. Date: Apr. 18, 2002

(51) Int. Cl.
*G01N 27/416* (2006.01)

(52) U.S. Cl. .................................. 324/429; 324/426
(58) Field of Classification Search ............... 320/128, 320/104, 136; 324/426, 429, 434
See application file for complete search history.

(56) References Cited

U.S. PATENT DOCUMENTS 6,211,681 B1 * 4/2001 Kagawa et al. ............. 324/426
6,381,114 B1 * 4/2002 Mansfield .................... 361/58

FOREIGN PATENT DOCUMENTS

| EP | 0 936 847 A1 | 8/1999 |
| FR | 274 8608 A1 | 5/1996 |
| FR | 279 1504 A1 | 3/2000 |
| WO | WO 9854811 | * 12/1998 |

* cited by examiner

*Primary Examiner*—Karl Easthom
*Assistant Examiner*—Robert Grant
(74) *Attorney, Agent, or Firm*—Nixon Peabody LLP; Jeffrey L. Costellia

(57) ABSTRACT

Modular unit connectable to a battery for monitoring its condition and protecting, including a housing which is directly connectable to the B battery posts of by means of receptor terminals clamped to said posts, the housing containing a first BD module, used to perform a disconnection of the supply of energy from said B battery; a second electronic module BM, used for a dynamic measurement of the B battery's state of health (SOH) and charge (SOC); a third electronic LCM module, used to control and manage all or part of the charges that supply said B battery, and a fourth electronic PDFS module, used to control the distribution of power supplied by said B battery.

19 Claims, 3 Drawing Sheets

MODULAR UNIT CONNECTABLE TO THE BATTERY OF A VEHICLE FOR MONITORING ITS CONDITION AND PROTECTING THE ELECTRICAL SYSTEM OF SAID VEHICLE

FIELD OF THE INVENTION

The present invention refers to a modular unit connectable to the battery of a vehicle for monitoring its condition, particularly to provide data related to the state of health (SOH) and charge (SOC) of the same, to protect the battery itself (preventing direct user access to the same), protection of said vehicle's electrical system and for centralized control and management of at least a significant part of the vehicle's electrical system supplied from said battery or associated/in communication with the same. To this effect this unit is designed to accommodate a series of electronic modules with at least a microprocessor or microcontroller, generally integrated and with the majority of them arranged on a mixed power and signal printed circuit, so that said modular unit is prepared for the centralised connection of various components, electrical, electromechanical and electronic devices and for the control of the vehicle's electrical system, by way of intelligent service box such as those disclosed in the patents EP-A-0936847 or U.S. Pat. No. 5,801,925.

Said modular unit is of the kind that includes a housing, which can be connected directly to the B battery posts by means of terminal receptors clamped to said posts, and whose housing contains at least a first BD module used to automatically disconnect (generally reversible) the energy supply from said B battery.

BACKGROUND OF THE INVENTION

The existence of units designed to be connected to the posts of a battery, suited to perform a selective, remote-controlled disconnection of said battery from the vehicle's electrical system, has been known for many years—quoting for example U.S. Pat. No. 3,692,965 (conductor which can be separated from one of the posts) and U.S. Pat. No. 3,821,501 (rotating remote operation shaft).

For its part patent EP-A-0161.365 discloses a module which comprises a housing which can be connected directly to the two battery posts by means of terminal receptors clamped to said posts, the housing containing a module integrating a remote controlled power switch activated by means of a signal entering a receiver, used to disconnect the power supply from said battery, the switch of which opens upon detecting a flow of current towards the starter motor and closes only if it receives an encoded signal.

U.S. Pat. No. 4,798,968 discloses an apparatus to disconnect a battery arranged in a housing prepared to be connected to the body of a battery, prepared for direct connection to one of the posts of said battery, which includes a circuit breaker which is kept closed and which opens, thus interrupting the flow of electricity from said battery, in response to a mechanism detecting extraordinary forces such as those which occur during a collision.

Patent GB-A-2.260.635 discloses a non-reversible vehicle battery disconnection system, designed to be assembled directly onto a battery, in which a detonator is used to cut off the electric power supply. Patent GB-A-2.321.749 discloses a vehicle battery disconnection system integrated into a housing designed to be assembled directly onto a battery post, the system of which is reversible and includes a sensor to detect an anomaly in the electrical system, such as a collision detector or an anti-theft device which turns on a switch, including furthermore, one or more fuses connected between said switch and output terminals.

U.S. Pat. No. 5,818,122 likewise discloses a disconnection system for a vehicle battery, directly assembled on a battery post, able to respond to an impact detection signal.

For its part U.S. Pat. No. 5,645,448 discloses a battery post connection module designed to protect the vehicle's electrical system and which comprises a fuse that protects the alternator cable from short circuit conditions.

None of said prior backgrounds proposes a unit arranged in a housing suited to be attached to the battery body, prepared for the control/management of the battery parameters, nor a centralised control/management from the module itself of the charging and of the vehicle's electrical system devices, supplied from said battery or permanently or temporarily connected to the same.

BRIEF DESCRIPTION OF THE INVENTION

The invention as it has been described above, proposes a modular unit that can be connected to the two battery posts with a general structure such as the one disclosed in said patent EP-A-161365, with switch action, or in the present case a switching device, being activated by an elevated flow of current, constituting a first electronic battery disconnection module or BD, being able to completely or partially isolate the vehicles' battery supplied electrical system, in response to a signal sent from a transmitter by a user, or in response to the detection of any anomaly in the vehicle's electrical system, the unit being characterised by comprising the following additional electronic modules, advantageously integrated into one single modular unit:

A second electronic BM module used for a dynamic measurement of B battery's state of health (SOH) and charge (SOC); and a third electronic LCM module used to control and manage all or part of the charges that supply said B battery.

In accordance to a preferred embodiment of the present invention, said first BD module disconnecting the supply of energy, is connected to and controlled by said third electronic LCM module, in such a way that the BD module is activated to perform an automatic disconnection in response to a request from the vehicles' electrical system, in the case of an accident, detecting an overcurrent or other anomaly occurring in said vehicle's electric energy distribution networks connected to said battery or associated with the same.

The unit is completed in a preferred embodiment of the invention by means of a fourth electronic PDFS module used to control the distribution of power supplied by said B battery, this fourth module including various fuses.

Said first electronic BD module comprises in one invention embodiment a switching device activated by elevated flow of current (relay or solid state device), being able to partially or completely isolate the electrical system associated with said B battery, the device being directly connected by one of its terminals to one of the B battery posts and controlled by a signal transmitted from said second charging control and management module.

In one example of a preferred embodiment, said three electronic BM, LCM and PDFS modules are arranged on a printed circuit board as one single integrated unit, making up a mixed power and signal circuit prepared for the logical interpretation of received signals, for the handling of these and for the execution of signals used to operate various electromechanical devices, solid state semiconductors or other components of the vehicle's electrical system, the unit at least incorporating a microprocessor or microcontroller, which is linked to corresponding bus control modules to control the charges.

In one preferred embodiment of the invention said second electronic BM module incorporates a number of circuits, components and a specific algorithm in said microprocessor or microcontroller to control the supply and management of various devices installed inside the B battery, such as thermal conditioning devices and measuring probes.

The unit is additionally composed of a high power BF fuse inserted between said first B battery disconnecting BD module and said fourth electronic PDFS module used to control the distribution of power in the vehicle's electrical system. Said BD module and said BF fuse are connected by means of a bus rod to withstand the required power conditions.

The unit is particularly suited for layouts where said B battery forms part of the vehicle's electrical distribution system which utilises networks working at two different voltage levels, or dual voltage systems, and particularly in cases where B is the battery with the highest voltage rating of the dual voltage system, which will require special protective measures.

A dual voltage system in a vehicle is defined as an electrical distribution system of a vehicle which uses networks working at two different voltage levels. Some components of said networks work at 14 V, as has been the case till today, in which case there is no need to introduce changes to its electrical distribution and control networks, while other components begin to work at 42 V, with an output and/or optimisation that is better suited for the demands put on them.

Said dual voltage system can basically be obtained in two ways: either with one single 42 V B battery and a unidirectional DC/DC 42 to 14 V converter, or with two 14 and 42 V batteries respectively, and a bi-directional DC/DC 14 to 42 V converter or vice versa, in addition to an alternator, which is needed in all of the cases.

The present invention would first and foremost find its application in automobile dual voltage systems where the power distribution layout includes an ISG (Integrated Starter Generator) with a 42 V auxiliary/help battery connected to an ISG converter which is in turn connected to the ISG unit.

Other features of the object of the present invention and specifically of the construction and integration of the different modules appear more clearly in the following description of a preferred embodiment given solely for the illustrative and non-limiting purpose.

DESCRIPTION OF THE DRAWINGS

Lastly

DETAILED DESCRIPTION OF EXAMPLES OF EMBODIMENTS

Figure 1:
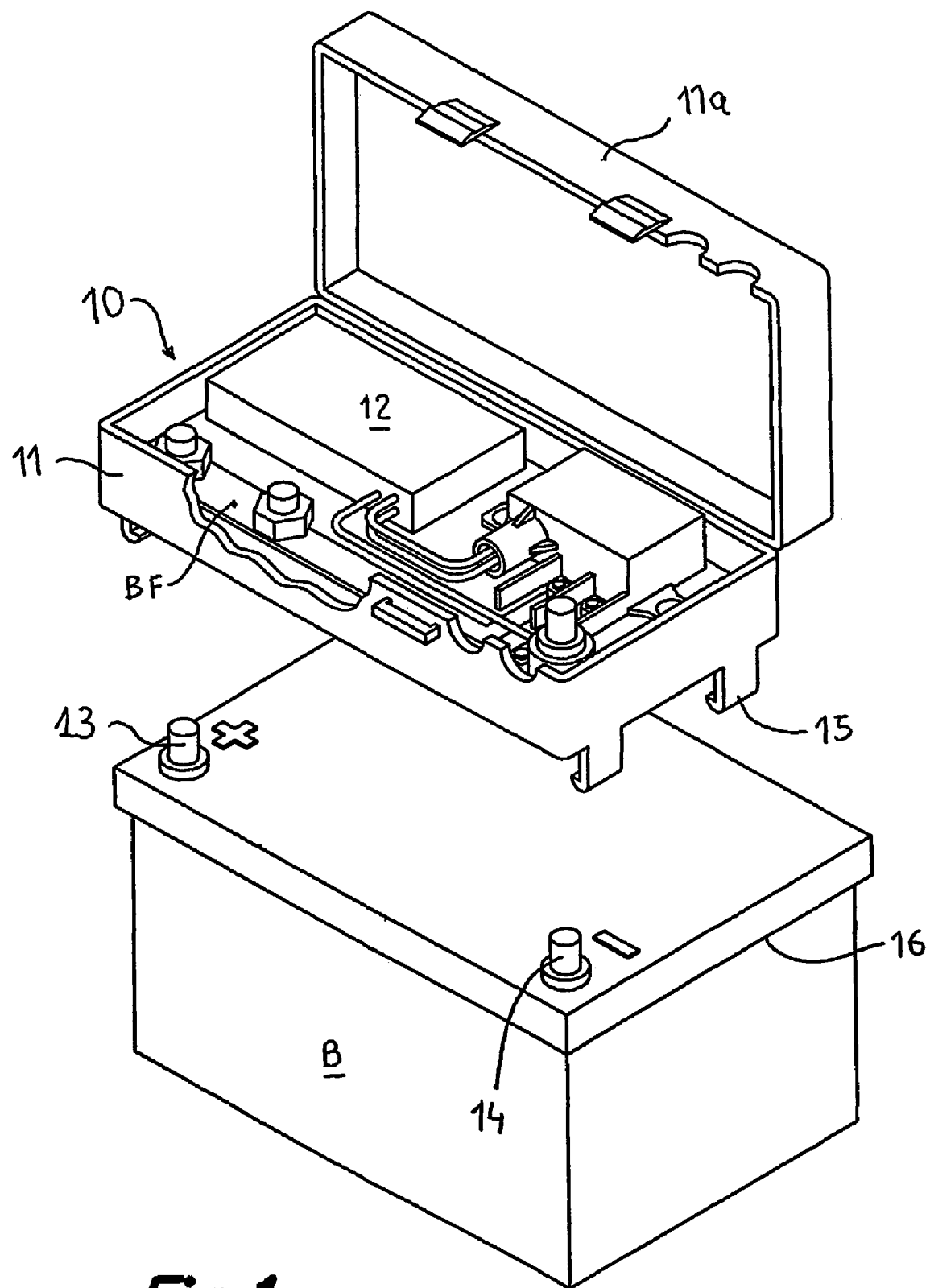
FIG. 1 is a perspective view of the unit according to the present invention, showing its basic modules grouped in a housing provided with a lid and with means of attachment of the same to the body of a battery.

Referring to the drawings, the proposed unit comprises a modular unit (10) assembled inside a housing (11), protected by a lid (11a), the housing (11) being directly connectable to the body of a B battery and connected to its two posts (13), (14), to which end flexible hooks (15) are shown in FIG. 1 suited to hook to the peripheral edge of the battery. Said unit (10) comprises a first BD module, used to disconnect the supply of energy from said B battery, a second electronic BM module, used for a dynamic measurement of the B battery's state of health (SOH) and charge (SOC), and a third electronic LCM module, dedicated to the control and management of all or part of the charges that feed said B battery. In the embodiment exemplified in FIG. 1 said second BM and third LCM modules are integrated into one unit mounted in a protective housing (12).

Referring to an example of a preferred embodiment of the present invention, a fourth electronic PDFS module has been suggested to control the distribution of power supplied by said B battery.

Figure 2:
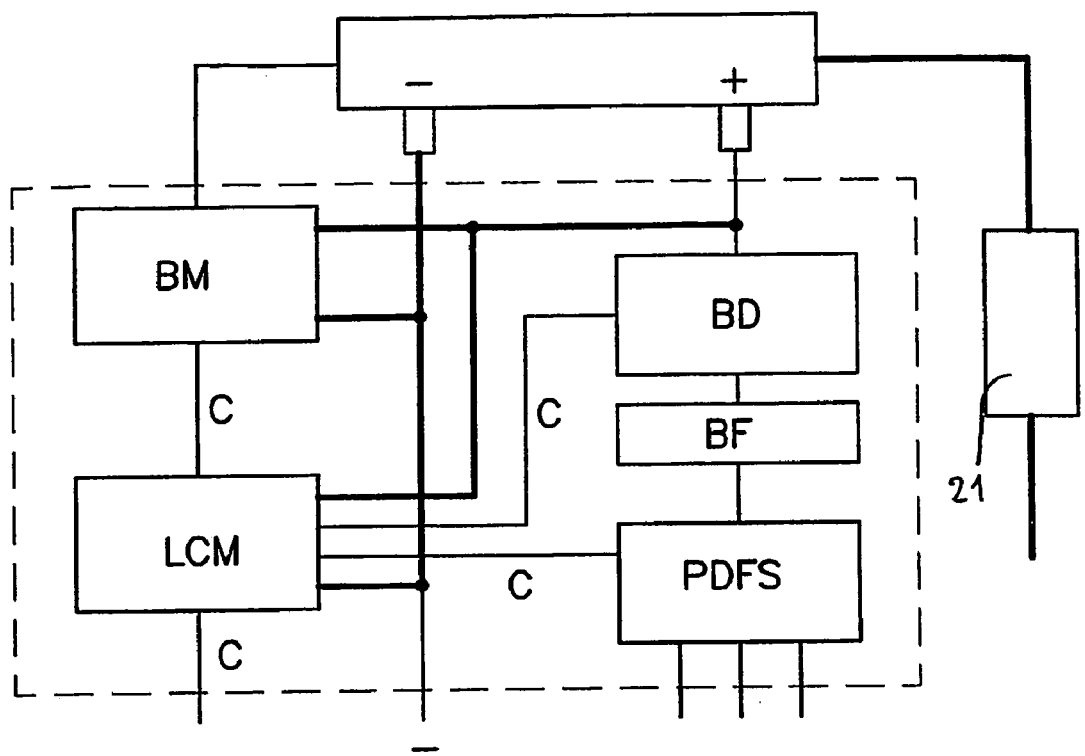
FIG. 2 is a schematic block diagram illustrating a version with four electronic modules according to the principles of the present invention, interconnected and grouped in a housing, the unit being connected to the two posts of a battery.
Figure 3:
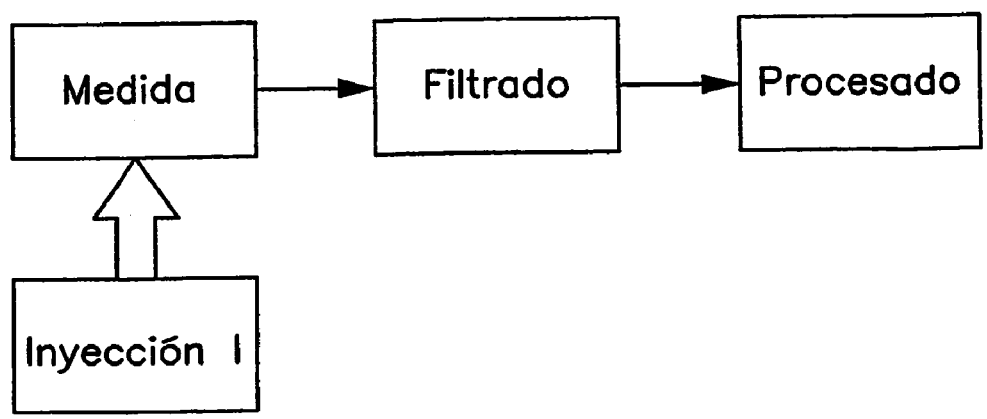
FIG. 3 is a schematic diagram illustrating the mode of action of the second electronic BM module in a simplified version (used basically to measure the state of health and charge of the battery), shown in FIG. 4 in more detail regarding a possible application with electronic components.

In FIG. 2 an example of the interconnection of said modules is shown, where the supply lines are shown as thick lines and the control lines as thinner lines. In this drawing, it can be seen that said first energy supply disconnection BD module is connected to and controlled by said third electronic LCM module, so that the BD module will be activated to perform an automatic disconnection in response to a request from the vehicle's electrical system, in the case of an accident, detection of overcurrents or other anomaly in the electric power distribution networks of said vehicle coming from said B battery or associated with the same.

As has been previously indicated, in one preferred embodiment said three BM, LCM and PDFS modules are arranged as one single integrated unit on a printed circuit board making up a circuit prepared for the logical interpretation of received signals, for the handling of these and for the execution of signals used to operate various electromechanical devices or solid state semiconductors, the unit incorporating at least a microprocessor or microcontroller, which is associated to the corresponding bus control modules to manage the charges.

Referring to an embodiment example of the present invention, said first electronic BD module comprises a switching device activated by elevated flows of current, being able to partially or completely isolate the electrical system associated with said B battery, the device being directly connected by one of its terminals to one of the posts of the B battery and controlled by a signal transmitted from said second charging control and management module.

For its part the second electronic BM module integrates means to control the supply and management of various devices installed inside the B battery, such as thermal conditioning devices and measuring probes.

As it has been shown in FIG. 1 the unit is provided with a high power BF fuse, which, referring to the embodiment shown in FIG. 2, will be inserted between said first B battery disconnecting BD module and said fourth electronic PDFS module, used to control the distribution of power to the vehicle's electrical system.

For its part, in said FIG. 2 an additional fuse (21) is also shown, which directly connects the battery to a number of the vehicle's specific electric or electronic components, which must be permanently powered.

Figure 4:
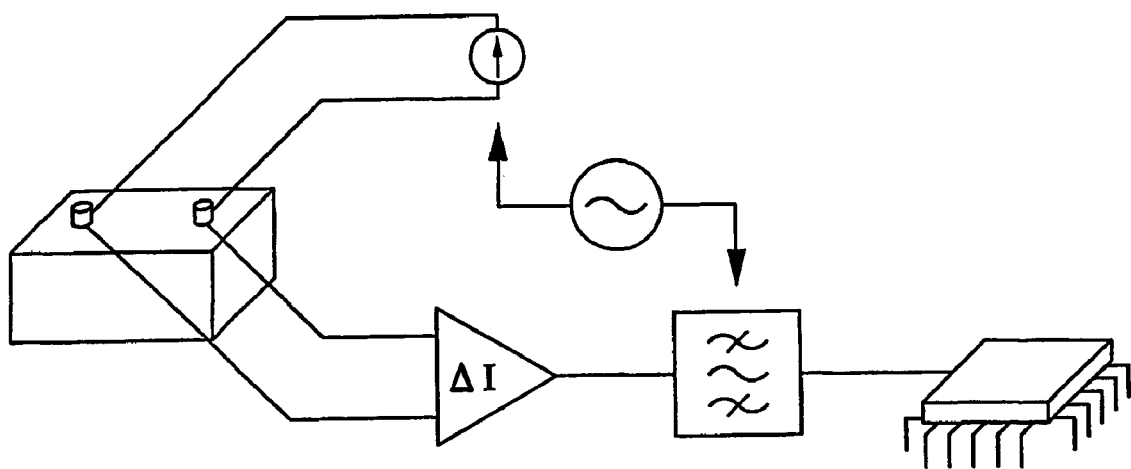

The second electronic BM module is primarily used for a dynamic measurement of the B battery's state of health (SOH) and charge (SOC) based on the measurement of the sinusoidal voltage increase when a sinusoidal current is added to the normal charging and discharging B battery current, said BM module including an intensity generator set up to induce a sinusoidal current of a predetermined frequency to the B battery posts, as well as a voltage terminal connecting said posts of the B battery to an amplifying device and a filtering unit, the latter receiving the frequency values of said induced current as it is schematically shown in FIG. 4.

In a preferred embodiment of the present invention said second module includes, furthermore, a probe for measuring the interior temperature of the battery.

Figure 5:
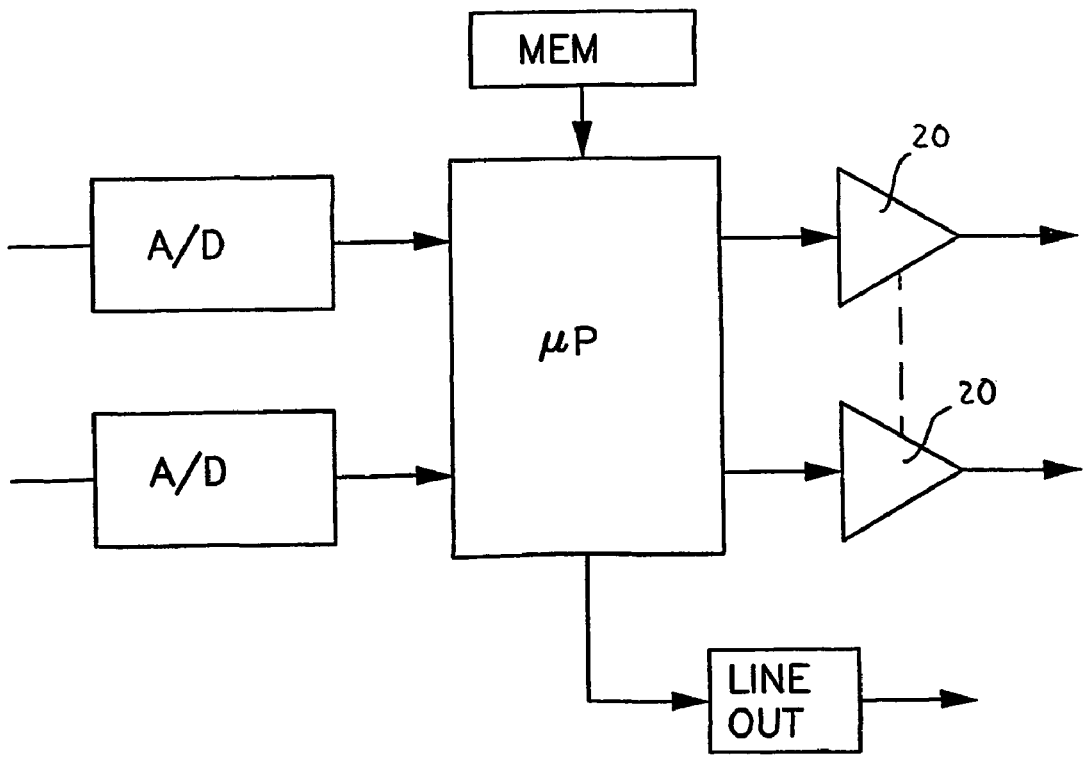
FIG. 5 shows a microcontroller, which may be implemented into the proposed modular unit, indicating its relationship with a number of peripheral input and output terminals.

As FIG. 5 shows, A/D converters are provided to introduce the values resulting from the state of health (SOH)/charge (SOC) measurement as well as said microprocessor or microcontroller temperatures. In said FIG. 5 and associated with said microprocessor a specification is shown, being a set of output lines and corresponding bus control modules (20) to manage the charges.

Referring to a preferred embodiment of the present invention, said third electronic LCM module, used for the control and management of the charges which supply said B battery, is controlled by the same microprocessor/microcontroller which is in charge of the second electronic BM module including a control algorithm, and said LCM module is connected to a data exchange system using a bus of the vehicle, such as a CAN bus.

The invention claimed is:

1. Modular unit connectable to a battery for monitoring its condition and protection, of the kind that includes a housing which is directly connectable to the B battery posts by means of terminal receptors clamped to said posts, the housing containing at least a first BD module used to disconnect the power supply from said B battery, characterised in that it also comprises:
  a second electronic BM module, used for a dynamic measurement of the battery's state of health (SOH); and charge (SOC); and a third electronic LCM module, used to control and manage all or part of the charges that supply said B battery;
  wherein said second electronic BM module dynamically measures the B battery's state of health (SOH) and charge (SOC) based on the measurement of the sinusoidal voltage increase when a sinusoidal current is added to the normal charging and discharging B battery current.

2. Unit in accordance with claim 1, characterised in that said fist power supply disconnecting module is connected to and controlled by said third electronic LCM module, to the effect that the BD module is activated to perform an automatic disconnection in response to a request from the vehicle's electrical system, in the case of an accident, detection of overcurrent or other anomaly in said vehicle's electrical distribution networks connected to said battery or associated with the same.

3. Unit in accordance with claim 1, characterised in that it integrates a fourth electronic PDFS module, used to control the distribution of power supplied by said B battery.

4. Unit in accordance with claim 2, characterised in that it integrates a fourth electronic PDFS module, used to control the distribution of power supplied by said B battery.

5. Unit in accordance with claim 2, characterised in that the two said BM and LCM modules are arranged as one single integrated unit on a printed circuit board making up a circuit prepared for the logical interpretation of received signals, for the handling of these and for the execution of signals used to operate various electromechanical devices or solid state semiconductors, the unit incorporating at least a microprocessor or microcontroller, which is associated to corresponding bus control modules to manage the charges.

6. Unit in accordance with claim 3, characterised in that the three 3M, LCM and PDFS modules are arranged as one single integrated unit on a printed circuit board making up a mixed power and signal circuit prepared for the logical interpretation of received signals, for the handling of these and for the execution of signals used to operate various electromechanical devices, solid state semiconductors or other components of the vehicle's electrical system, the unit incorporating at least a microprocessor or microcontroller, which is associated to corresponding bus control modules to manage the charges.

7. Unit in accordance with claim 6, characterised in that said first electronic module comprises a switching device activated by elevated flows of current, designed to partially or completely isolate the electrical system associated with said B battery, the device being directly connected by one of its terminals to one of the B battery posts and controlled by means of a signal transmitted from said third charging control and management LCM module.

8. Unit in accordance with claim 1, characterised in that said second electronic BM module integrates means of controlling the supply and management of various devices installed inside the B battery, such as thermal conditioning devices and measuring probes.

9. Unit in accordance with claim 4, characterised in that the unit is equipped with
  a high power BF fuse inserted between said first B battery disconnecting BD module and said fourth electronic PDFS module, used to control the distribution of power in the vehicle's electrical system.

10. Modular unit connectable to a battery for monitoring its condition and protection, of the kind that includes a housing which is directly connectable to the B battery posts by means of terminal receptors clamped to said posts, the housing containing at least a first BD module used to disconnect the power supply from said B battery, characterised in that it also comprises:
  a second electronic BM module, used for a dynamic measurement of the battery's state of health (SOH); and charge (SOC); and a third electronic LCM module used to control and manage all or part of the charges that supply said B battery;
  wherein said first power supply disconnecting module is connected to and controlled by said third electronic LCM module, to the effect that the BD module is activated to perform an automatic disconnection in response to a request from the vehicle's electrical system, in the case of an accident, detection of overcurrent or other anomaly in said vehicle's electrical distribution networks connected to said battery or associated with the same;
  wherein the two said BM and LCM modules are arranged as one single integrated unit on a printed circuit board making up a circuit prepared for the logical interpretation of received signals, for the handling of these and for the execution of signals used to operate various electromechanical devices or solid state semiconductors, the unit incorporating at least a microprocessor or microcontroller, which is associated to corresponding bus control modules to manage the charges; and wherein said second electronic BM module, used for a dynamic measurement of the B battery's state of health (SOH) and charge (SOC), is based on the measurement of the sinusoidal voltage increase when a sinusoidal current is added to the normal charging and discharging B battery current, said BM module including an intensity generator set up to induce a sinusoidal current of a predetermined frequency to the B battery posts, as well as a voltage terminal connecting said B battery posts to an amplifying device and a filtering unit, the latter receiving the frequency values of said induced current.

11. Modular unit connectable to a battery for monitoring its condition and protection, of the kind that includes a housing which is directly connectable to the B battery posts by means of terminal receptors clamped to said posts, the housing containing at least a first BD module used to disconnect the power supply from said B battery, characterised in that it also comprises:

a second electronic BM module, used for a dynamic measurement of the battery's state of health (SOH); and charge (SOC); and a third electronic LCM module, used to control and manage all or part of the charges that supply said B battery; and a fourth electronic PDFS module, used to control the distribution of power supplied by said B battery;

wherein the three 3M, LCM and PDFS modules are arranged as one single integrated unit on a printed circuit board making up a mixed power and signal circuit prepared for the logical interpretation of received signals, for the handling of these and for the execution of signals used to operate various electromechanical devices, solid state semiconductors or other components of the vehicle's electrical system, the unit incorporating at least a microprocessor or microcontroller, which is associated to corresponding bus control modules to manage the charges; and wherein said second electronic BM module, used for a dynamic measurement of the B battery's state of health (SOH) and charge (SOC), is based on the measurement of the sinusoidal voltage increase when a sinusoidal current is added to the normal charging and discharging B battery current, said BM module including an intensity generator set up to induce a sinusoidal current of a predetermined frequency to the B battery posts, as well as a voltage terminal connecting said B battery posts to an amplifying device and a filtering unit, the latter receiving the frequency values of said induced current.

12. Unit in accordance with claim 10, characterised in that said second module includes, furthermore, a probe for measuring the interior temperature of the B battery.

13. Unit in accordance with claim 11, characterised in that said second module includes, furthermore, a probe for measuring the interior temperature of the B battery.

14. Unit in accordance with claims 12 or 13, characterised in that it is provided with A/D converters to introduce the values resulting from B battery's state of health (SOH)/charge (SOC) measurement as well as temperature into said microprocessor or microcontroller of which there are at least one.

15. Unit in accordance with claim 1, characterised in that said third electronic LCM module is controlled by the same microprocessor/microcontroller which is in charge of the second electronic BM module including a control algorithm, and said LCM module is connected to a data exchange system using a bus of the vehicle, such as a CAN bus.

16. Unit as in one of claims 1 or 3–6,
wherein said housing covers the upper part of the B battery, is clamped to the two posts, and is provided with detachable means of attachment having hooks that engage a peripheral edge of the B battery body.

17. Unit in accordance with one of the claims 1–6, characterised in that said B battery disconnecting module works automatically and is reversible.

18. Unit in accordance with claim 1, 3, or 4, characterised in that said B battery forms part of an the vehicle's electrical distribution system, using networks working at two different voltage levels, or a dual voltage system.

19. Unit in accordance with claim 18, characterised in that said B battery is the battery with the highest voltage of the dual voltage system.

* * * * *